Aug. 9, 1966 P. A. CLAVIER ETAL 3,265,978

D.C. PUMPED QUADRUPOLE PARAMETRIC AMPLIFIER

Filed Aug. 17, 1959 2 Sheets-Sheet 1

WITNESSES
John E. Healy, Jr.
James F. Young

INVENTORS
Philippe A. Clavier, Daniel C. Buck &
Carl H. Scullin
BY
Charles F. Renz
ATTORNEY United States Patent Office 3,265,978
Patented August 9, 1966

3,265,978
D.C. PUMPED QUADRUPOLE PARAMETRIC AMPLIFIER

Philippe A. Clavier, Trumansburg, Daniel C. Buck, Veteran Township, Chemung County, and Carl H. Scullin, Bressport, N.Y., assignors to Westinghouse Electric Corporation, East Pittsburgh, Pa., a corporation of Pennsylvania Filed Aug. 17, 1959, Ser. No. 834,217
2 Claims. (Cl. 330—4.7)

This invention relates to electron discharge devices and more particularly to an amplifier tube.

Present microwave amplifiers can be divided into two main classes. One type, which includes tubes such as klystrons, traveling wave tubes and some crossed field devices, achieves amplification by converting energy from a D.C. power source into RF signal energy. A second type, such as the parametric amplifier, achieves amplification by converting energy from an A.C. power source or pump into RF signal energy. Each of these classes of microwave amplifiers has certain limitations, for example, the tubes in the first class are limited in either efficiency, gain or bandwidth and in addition these tubes have the disadvantage that very small dimensions are required at high frequencies of operation. Amplifiers of the second class are relatively new and their performance characteristics have not been fully explored but they are known to have the disadvantage of small dimensions at high frequencies and a highly distorted output frequency spectrum. Also, they require a pump generator which must operate at a higher frequency than that of the signal being amplified. This requirement obviously presents a very serious limitation for high frequency operation.

It is therefore an object of this invention to provide an improved amplifier, which possesses all the advantages of the tubes in the two classes mentioned before but which does not have the limitations of these tubes.

It is another object of this invention to provide a microwave amplifier which converts D.C. power into RF signal energy at a very high efficiency.

It is a further object of this invention to provide a microwave amplifier which utilizes a transverse modulation to obtain amplification of the input RF signal.

It is an additional object of this invention to provide a microwave amplifier in which the amplifying interaction process is independent of the signal frequency.

It is an auxiliary object of this invention to provide a microwave amplifier from which a high gain may be obtained without distorting the input signal.

It is a supplementary object of this invention to provide a microwave amplifier having means to provide the proper average electron beam velocity in relation to the potential distribution at the location of the electron beam to obtain amplification of an input signal.

These and other objects of this invention will be apparent from the following detailed description taken in accordance with the accompanying drawing, throughout which like reference characters indicate like parts which drawing forms a part of this application, and in which.

Figure 1:
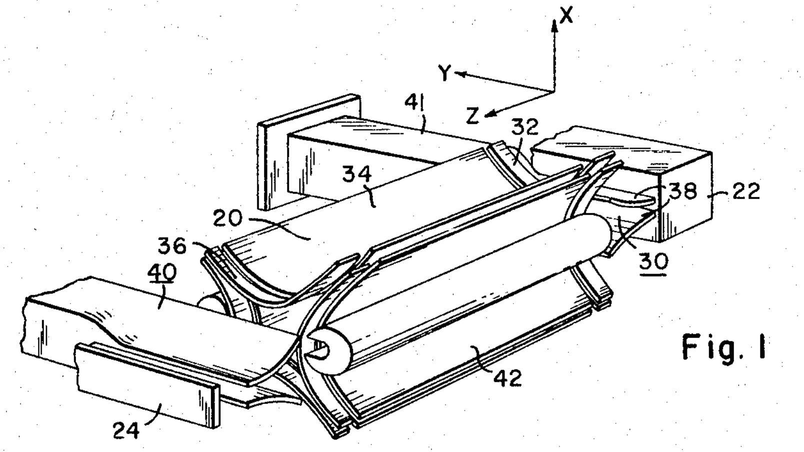
FIGURE 1 shows a tube embodying the invention which uses diverting forces in the interaction process.

In its broader aspects this invention describes a device which achieves, by means of an electrostatic diverting field, high frequency amplification of the transverse modulation impressed on an electron beam. Referring now to FIGURE 1 of the drawings there is shown a microwave amplifier tube constructed in accordance with the invention. The tube 20 comprises an evacuable envelope (not shown) having at one end an electron gun 22 and at the other end a collector electrode 24. The cathode of the electron gun 22 has an emission surface which is coated with an electron emissive substance and the cathode is heated to emission temperature by any suitable means such as a heater (not shown). A cloud of electrons is thermionically emitted from the emission surface of the cathode and fills the region immediately adjacent thereto. The anode of the electron gun is maintained at an adjustable positive potential with respect to the cathode and the action of this electric field draws and focuses the emitted electrons through the aperture of the anode and thereby forms a high perveance beam of electrons 28. The formed and focused electron beam 28 is then accelerated toward the input coupler 30 substantially along the longitudinal axis of the tube.

An input RF signal is introduced through the input coupler 30 and this input signal is impressed upon the electron beam 28 as it passes through the input coupler 30 so as to modulate the beam according to the input signal. The input coupler 30 may be of any suitable type of transverse coupler. In the embodiment shown in the drawings, the coupler comprises two structures 38 symmetrically disposed around the central plane of the tube and separated by an opening to permit passage of the beam. Outside the beam region, the coupler may be continued by a transition 41 to the usual type of commercially available waveguide. The beam then passes through a coupler exit lens system 32 which serves to further collimate the beam 28. The lens system 32 illustrated in the drawings comprises four curved electrode members symmetrically placed about the axis of the tube and to which a suitable potential is applied. In many cases, the necessary input beam conditions to an interaction region 26 do not match exactly the boundary conditions necessary for proper operation of the couplers. The interaction region 26 comprises, in general, spaced electrodes to which a suitable potential or potentials is applied to obtain the proper action on the electron beam to insure amplification of the beam as it passes through the interaction region 26. A detailed description of the electrode structure in the interaction region will be included below. The coupler exit lens 32 may also be designed to achieve the desired boundary conditions between the coupler 30 and the interaction region 26. The beam then passes through the interaction region 26 where it is acted on by the applied electrostatic potential to amplify the signal imposed upon the electron beam in the input coupler.

As the amplified electron beam leaves the interaction region 26 a coupler input lens system 36 acts to collimate the beam as it enters the output coupler 40. The coupler input lens 36 is similar in structure to the coupler output lens 32 and may also be used to match the boundary conditions between the interaction region 26 and the output coupler 40. The output coupler 40 develops an output signal in response to the transverse modulation imposed upon the electron beam 28 in the input coupler 30 and amplified through the interaction region 26. The output coupler 40 is similar in structure to the input coupler 30 and the output signal is taken from the output coupler 40 to an external utilization circuit. The electron beam 28 is terminated upon the collector electrode 24 which is maintained at a positive potential with respect to the cathode.

Figure 2:
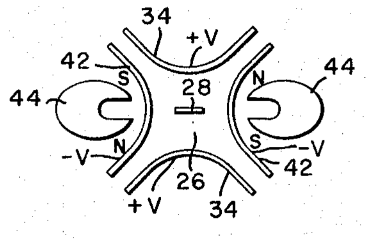
FIG. 2 shows a section view of the electrode structure in the interaction region for the tube of FIG. 1.

The electrode structure within the interaction region may be that shown in FIGS. 1 and 2. This electrode structure comprises upper and lower electrodes 34 and right and left electrodes 42. The electrodes are comprised of curved elongated members which are symmetrically placed with respect to the tube axis. The upper and lower electrodes 34 are maintained at a higher potential than the right and left electrodes 42. Because the interaction is independent of the signal frequency the band width of the device is limited only by the band width of the input and output couplers 30 and 40. To obtain the proper diverting field distribution the field of an electrostatic quadrupole structure must be used as shown in FIG. 2. The upper and lower electrodes 34 of the qudrupole are maintained at a higher potential and they bound the interaction region 26 in the direction of the interaction. While very large gain per unit length can be obtained in principle the path of the unperturbed beam is inherently unstable and the beam spread in the $x$ direction overshadows any useful effect.

In order to render the structure useful, focusing of the beam in the direction of interaction must be provided without cancelling the effect of the quadrupolar field resulting from the potential applied to the electrodes bounding the interaction region. This focusing can be achieved by separating the electrostatic quadrupole into segments in the direction of flow of the beam and varying the axial potential from segment to segment to provide periodic electrostatic focusing. This focusing, which may or may not be periodic, diminishes somewhat the theoretical gain per unit length which can be achieved but quite useful gains are possible.

Another way to obtain focusing so as to render the structure useful is to cancel the diverting forces in the direction of interaction at the location of the undisturbed beam without cancelling these forces outside of this location. This result can be accomplished by the use of a magnetic quadrupole which produces a field that varies with displacement in the direction of interaction as shown in FIG. 2. The magnetic quadrupole shown in FIG. 2 which comprises two horseshoe magnets 44 with opposed poles spaced adjacent the right and left hand electrodes 42 may be used to produce the desired magnetic field. When the beam is deflected outside the linear portion of the magnetic field, the diverting forces are stronger than the magnetic restoring forces and the amplication process takes place. When the electron beam remains in the linear portion of the magnetic field, the diverting forces are exactly cancelled and focusing can occur. While the undisturbed beam can be focused, on the other hand, the amplification process does not occur when the beam is not sufficiently deflected and a threshold of input signal level exists below which no gain is possible.

Figure 3:
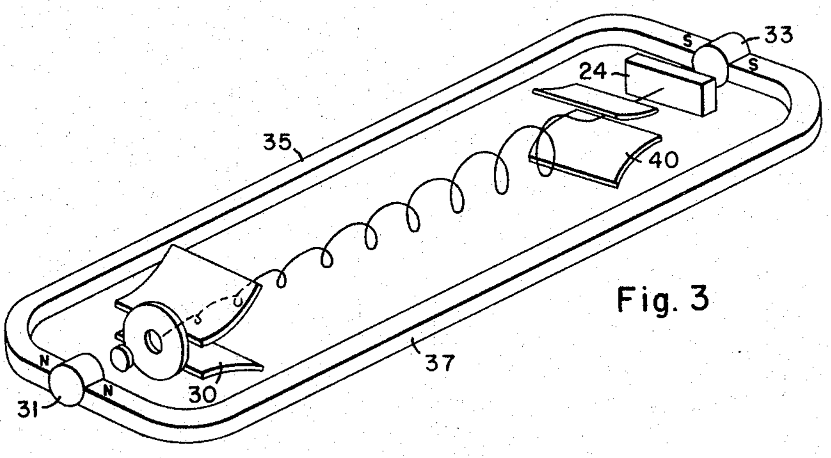
FIG. 3 shows a schematic diagrammatic view of the helical electron motion in an amplifier tube.

In certain cases, it may be desirable to increase the length and thus the gain of the interaction region. One way of doing this is by replacing the quadrupolar structure shown in FIG. 1 by a helicoidal structure such as that shown schematically in FIG. 3. This device achieves high frequency amplification of the transverse modulation of an electron beam by means of a transversely directed diverting electrostatic field. Both the electrostatic field and the electron beam respectively have coinciding helical shapes. The helical electron beam trajectory is formed by placing the electron beam in an axial magnetic field. The axial magnetic field may be generated by any suitable means. One way of generating an axial magnetic field is by the use of a pair of pole pieces 31, 33 placed adjacent opposite ends of the tube. A pair of U-shaped magnets 35, 37 having like poles adjacent each other and the pole pieces 31, 33 positioned between the like poles provides the desired magnetic field. The helically disposed electrostatic field for the device is generated by any suitable means.

Figure 4:
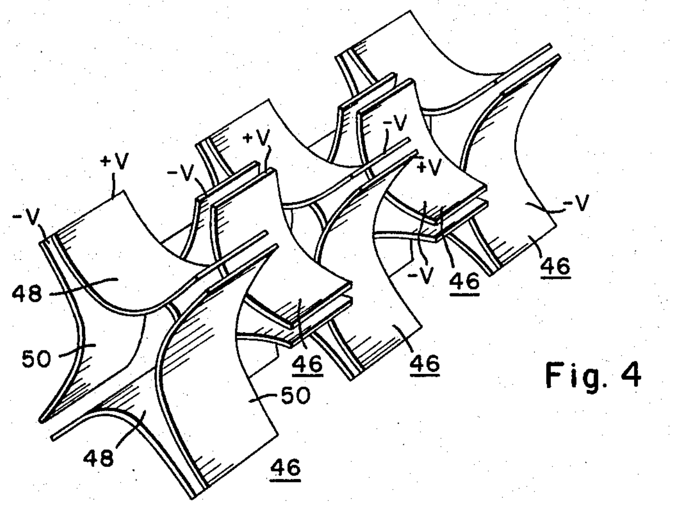
FIG. 4 shows the rotating electrostatic quadrupole structure for the amplifier tube.
Figure 6:
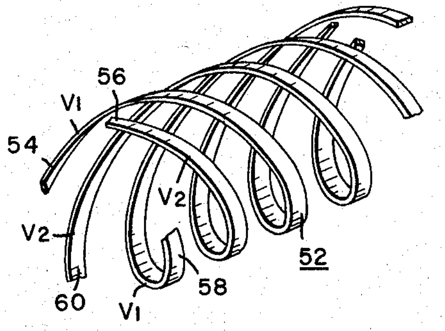
FIG. 6 shows a view of a quadri-filar helix suitable for developing a helically disposed electrostatic field.

One electrode structure for generating a helically disposed electrostatic field is shown in FIG. 4. This structure comprises an array of short quadrupoles 46, each of which is rotated with respect to the next. The electrons rotate 45° while traversing each quadrupole. The quadrupoles 46 comprise four spaced curved members symmetrically disposed about the axis of the tube. Opposite electrode members have the same potential applied with one pair such as the top and bottom electrode members 48 shown at the left end of the view having a positive potential, and the other pair, such as the left and right electrode members 50 at the left end of the view, having a negative potential applied to them. The same two potentials are used on all the quadrupoles. Another means for developing a helically disposed electrostatic field is shown in FIG. 6. This structure comprises a quadri-filar helix 52 having a predetermined period. The diametrically opposite helices 54, 58 or 56, 60 are operated at the same potential. The two sets of diametrically opposite helices 54, 58 and 56, 60 are operated at different potentials. In all cases, the input couplers must be oriented so as to provide a deflection of the electron beam in the direction of maximum outward radial field at the entrance to the interaction region.

Figure 5:
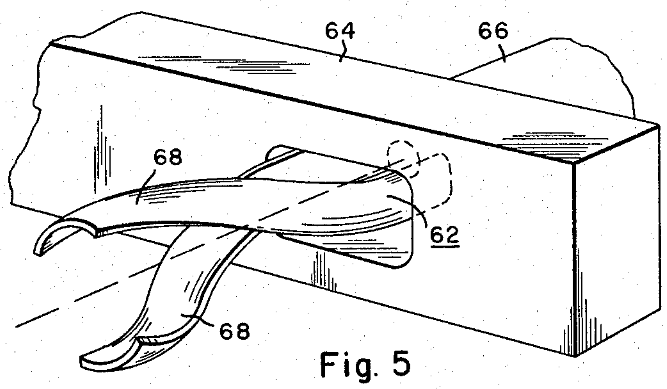
FIG. 5 shows a perspective view of a signal input coupler for an amplifier tube.

The radius of the helical trajectories of the electrons drifting in an axial magnetic field is increased by the use of electrostatic radial diverting forces and thus amplification is obtained. A solid cylindrical electron beam is used which when undisturbed flows along the axis of the tube. An axial magnetic field is provided in the interaction region which extends to the cathode of the electron gun. Because the couplers are in the magnetic field, the transverse deflection is accompanied by rotation of the beam at the cyclotron frequency. In certain cases, it may be desirable for the field of the coupler to follow the rotation of the beam. This can be done by any suitable means. One suitable means for accomplishing the rotation of the field of the coupler is by means of the coupler 62 shown in FIG. 5. In this structure, the input waveguide 64 is disposed adjacent to the electron gun 66 and at substantially right angle thereto. The arm members 68 of the coupler are twisted in a substantially helical fashion about the tube axis so as to impart a rotation to the field of the coupler thus increasing the effectiveness of the coupler.

In the interaction region the electrons see a radially diverting field. An electron entering the interaction region at a certain finite radius, while drifting in the axial direction at a constant velocity, and rotating around the axis at the cyclotron frequency will also spiral outward with an increasing radius.

In order to obtain a linear radial field it is necessary to use an electrostatic quadrupole. The electron beam must intersect the cross section of the quadrupole at a point where the electric field is radial and directed outward. In order for this to be true in all cross sections it is necessary to rotate the field of the quadrupole around its axis from cross section to cross section to obtain the spiral period of rotation of the field.

A possible structure for accomplishing this rotation is shown in FIG. 4. This structure is made up of an array of short quadrupoles, each of which is rotated with respect to the next. The same two potentials are used on all the quadrupoles. Another structure for accomplishing this rotation is shown in FIG. 6. This structure is a quadri-filar helix which has the desired period. The diametrically opposite helices are operated at the same potential. The two sets of diametrically opposite helices are operated at different potentials. In all cases the input couplers must be oriented so as to provide a deflection in the direction of maximum outward radial field at the entrance to the interaction region. Since the electrons in the undeflected beam do not rotate around the axis they see the quadrupolar field as a force varying periodically inward and outward. This field can be chosen such that the periodic variation of this force on the electrons is small enough so that the radial motions of the electrons in the undisturbed beam are stable and focusing results.

While the present invention has been shown in only a few forms, it will be obvious to those skilled in the art that it is not so limited but is susceptible of various changes and modifications without departing from the spirit and scope thereof.

We claim as our invention:

1. A microwave amplifier comprising means for projecting an electron beam along an axis, a signal input coupling means, an interaction region, and a signal output coupling means spaced along said axis, said interaction region bounded by a plurality of electrodes symmetrically spaced about said axis, said electrodes arranged in a plurality of groups spaced end to end along said interaction region, said groups rotated about the axis progressively as the interaction region is traversed, electrostatic potentials applied to each of said groups to produce a spiral outwardly directed electric field within said interaction region, a magnetic field parallel to said axis, the signal input coupler responsive to an input signal to provide deflections of said beam from said axis, said magnetic field acting on said electron beam to produce a spiral motion about said axis, said electric field within said interaction region adapted to increase the distance from said axis as it traverses said interaction region, said signal output coupler responsive to said deflections in said electron beam to produce an output signal that is an amplified signal representative of said input signal.

2. Apparatus for parametrically amplifying signal energy which comprises: means for projecting an electron beam along a predetermined axis; means for subjecting electrons in said beam to a magnetic field having its flux lines disposed parallel with said axis; means for modulating said electrons with input signal energy to impart motion to said electrons along a helical path of a predetermined pitch related to the strength of said magnetic field and with a radius representing the amplitude of said signal energy; means including electrode elements and a unidirectional potential source connected thereto for subjecting said electrons to non-homogeneous field forces, the strength of which varies substantially linearly with distance from said axis, unidirectional in a time-domain, and defining a field pattern with a plurality of pairs of spaced-opposed poles disposed along interleaved helicoidal loci which are coaxial of said helical path, are of the same pitch as and co-directional with said helical path and which have a coaxial length corresponding to at least one convolution of said helical path, the even numbered pairs of said poles being of one polarity and the odd numbered pairs of said poles being of the opposite polarity; and means for extracting amplified signal energy from said electron motion.

References Cited by the Examiner

UNITED STATES PATENTS

| | | | |
|---|---|---|---|
| 2,064,469 | 12/1936 | Haeff | 315—7 X |
| 2,089,692 | 8/1937 | Drewanz et al. | 313—83 X |
| 2,270,777 | 1/1942 | Von Baeyer | 315—7 X |
| 2,414,121 | 1/1947 | Pierce | 315—7 X |
| 2,424,965 | 8/1947 | Brillouin | 315—39.3 X |
| 2,565,357 | 8/1951 | Donal | 315—5.28 X |
| 2,638,561 | 5/1953 | Sziklai | 313—84 X |
| 2,650,956 | 9/1953 | Heising | 315—3 X |
| 2,830,221 | 4/1958 | Dodds | 315—3.6 |
| 2,834,908 | 5/1958 | Kompfner | 315—3.6 |
| 2,844,753 | 7/1958 | Quate | 315—39.3 |
| 2,876,373 | 3/1959 | Veith et al. | 313—84 |
| 2,903,620 | 9/1959 | Bartram | 313—83 X |
| 2,904,720 | 9/1959 | Bell | 315—5.34 |
| 2,942,144 | 6/1960 | Weibel | 315—7 |
| 2,959,706 | 11/1960 | Cutler | 315—3 |
| 3,148,303 | 9/1964 | Clavier et al. | 330—4.7 |

OTHER REFERENCES

"A Low-Noise Electron-Beam Parametric Amplifier," by R. Adler et al., Proceedings I.R.E., vol. 46, No. 10, October 1958, pp. 1756–1757.

ROY LAKE, *Primary Examiner.*

RALPH G. NILSON, ARTHUR GAUSS, *Examiners.*

G. R. OFELT, E. STRICKLAND, D. R. HOSTETTER, V. LAFRANCHI, *Assistant Examiners.*